(12) United States Patent
Derderian et al.

(10) Patent No.: US 6,245,191 B1
(45) Date of Patent: Jun. 12, 2001

(54) WET ETCH APPARATUS

(75) Inventors: Garo J. Derderian; Gurtej S. Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/237,456

(22) Filed: Jan. 26, 1999

Related U.S. Application Data

(62) Division of application No. 08/918,689, filed on Aug. 21, 1997, now Pat. No. 5,914,052.

(51) Int. Cl.$^7$ ................................................. C23F 1/02
(52) U.S. Cl. ........................... 156/345; 216/83; 438/745
(58) Field of Search ..................... 156/345 L; 216/83, 216/90, 92; 210/198.2, 502.1; 438/745

(56) References Cited

U.S. PATENT DOCUMENTS

| | | | |
|---|---|---|---|
| 5,119,116 | 6/1992 | Yu | 347/65 |
| 5,292,445 | 3/1994 | Fjare et al. | 216/83 |
| 5,464,480 | 11/1995 | Matthews | 216/83 |
| 5,686,314 | * 11/1997 | Miyazaki | 436/177 |

FOREIGN PATENT DOCUMENTS 63-315930 * 12/1988 (JP).
06192861 * 7/1994 (JP).

* cited by examiner

*Primary Examiner*—Gregory Mills
*Assistant Examiner*—Alva C Powell
(74) *Attorney, Agent, or Firm*—Workman, Nydegger & Seeley

(57) ABSTRACT

Wet etch methods of anisotropically etching a substantially vertical etched step in a film. Methods of forming a substantially vertical etched step include depositing an etching solution droplet upon the surface of the film to be etched and monitoring at least one characteristic parameter of the etching solution droplet. Control of the etching solution droplet is carried out corresponding to monitored parameters of the etching solution droplet. Control is carried out through infusion and effusion of the etching solution droplet in order to replenish the chemical reactants in the etching solution droplet. Replenishing the etching solution droplet, while keeping the droplet of a uniform size, maintains a uniform etching chemistry as the etching solution droplet would otherwise constantly change in its chemistry as it etches material from the surface being etched. Control measures include infusion and effusion of the etching solution droplet, droplet size maintenance, and end-point detection for when the etching solution droplet has fully penetrated the film or surface to be etched. Control measures also include control of the chemical potential, including surface tension chemical reactant and reaction product boundary layers within the etching solution droplet, and turbulent or laminar flow control within the etching solution droplet.

25 Claims, 5 Drawing Sheets

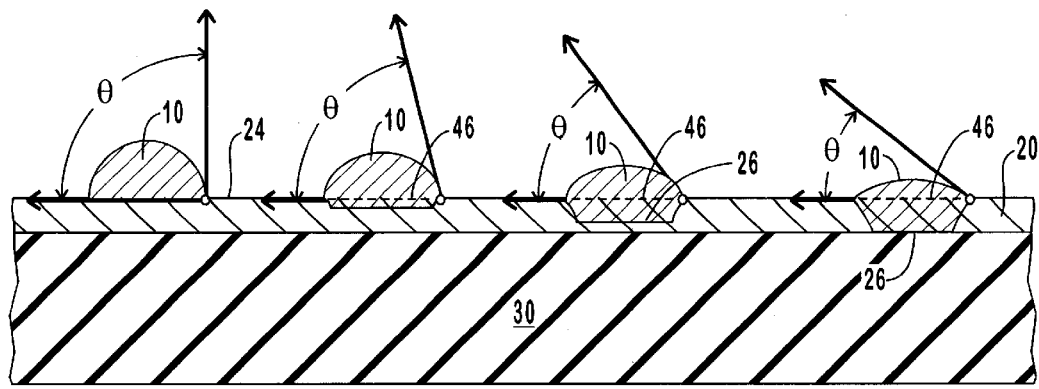
FIG. 3
(PRIOR ART)
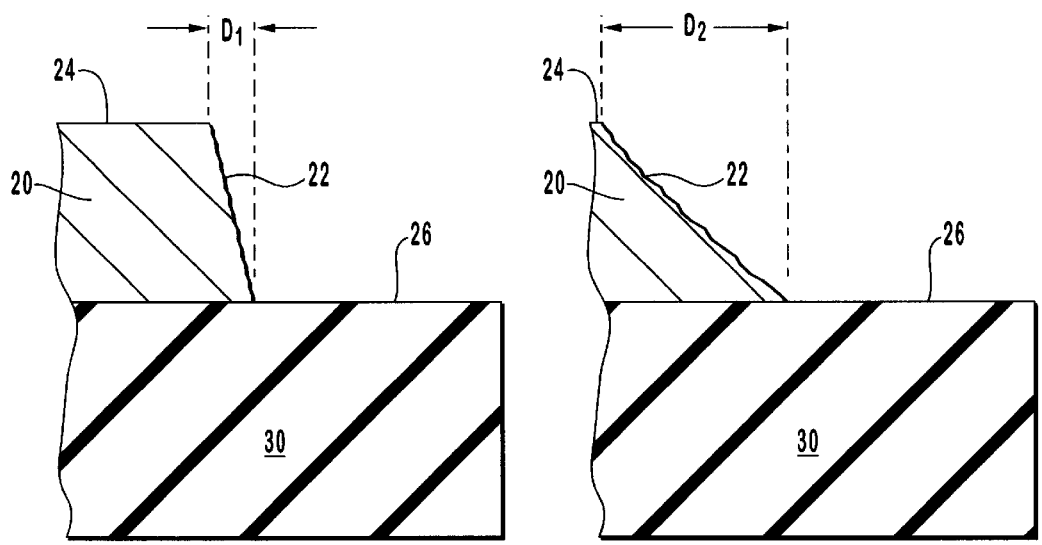
FIG. 4
FIG. 5
(PRIOR ART)

WET ETCH APPARATUS

This application is a divisional of application Ser. No. 08/918,689, U.S. Pat. No. 5,914,052 filed on Aug. 21, 1997, which is incorporated herein by reference.

BACKGROUND OF THE INVENTION

1. The Field of the Invention

The present invention relates to methods of etching by use of maskless techniques. In particular the present invention relates to methods of etching films under conditions that cause substantially vertical etch side walls into the film. More particularly, the present invention relates to methods of infusion and effusion of an etch solution droplet as it rests upon the film to be etched.

2. The Relevant Technology

In the microelectronics industry, a substrate refers to one or more semiconductor layers or structures which includes active or operable portions of semiconductor devices. The term substrate assembly is intended herein to mean a substrate having one or more layers or structures formed thereon. As such, the substrate assembly may be, by way of example and not by way of limitation, a doped silicon semiconductor substrate typical of a semiconductor device.

In the microelectronics industry, films are required for such structural operations as gate oxide layers, etch barriers, polysilicon layers, and epitaxial layers.

FIG. 1 depicts the wetting of an etching solution droplet 10 on a film 20. In the droplet, an angle known as θ or the contact angle, forms between the plane of the solid surface to be wetted and a tangent to the perimeter of the liquid contacting the solid surface. In describing the forces at a solid-liquid-gas triple point interface 12, three surface tensions must balance in a static state. The surface tension between the solid and the gas, $\gamma_{sg}$, is usually very small relative to the other surface tensions. In FIG. 1 the surface tension of the solid and gas, $\gamma_{sg}$, is depicted as a vector 14 at solid-liquid-gas triple point interface 12. The surface tension of the solid and liquid, $\gamma_{sl}$, is depicted as a vector 16 at solid-liquid-gas triple point interface 12. The surface tension of the liquid and the gas, $\gamma_{lg}$, is depicted as a vector 18 that forms an angle, θ with the solid surface. A force balance around solid-liquid-gas triple point interface 12 reveals that $$\gamma_{sg} - \gamma_{sl} = \gamma_{lg} \cos\theta. \tag{1}$$

This expression can be rearranged to be solved for the contact angle θ as $$\cos\theta = (\gamma_{sg} - \gamma_{sl})/\gamma_{lg}. \tag{2}$$

FIG. 2 illustrates the interplay between surface tension of the liquid in the gas and surface tension of the solid in the liquid where the surface tension of the solid is held constant. If the surface tension of the liquid in the gas is high, an obtuse angle, $\theta_1$ is formed. If the surface tension of the solid in the liquid exactly equals the surface tension of the solid in the gas then the contact angle is a right angle, $\theta_2$ and the surface of the solid is neutral to hydrophobicity or hydrophilicity. If the surface tension of the liquid in the gas is low enough, an acute angle $\theta_3$ is formed and the surface of the solid is hydrophilic to the liquid. Equation 2 does not apply when complete wetting occurs such that $\theta_3$ is zero degrees and $\gamma_{sg} > \gamma_{sl} + \gamma_{lg}$, and does not apply when there is no wetting at all such that $\theta_1$ is 180 degrees and $\gamma_{sl} > \gamma_{sg} + \gamma_{lg}$.

During etch of a thin film in preparation for thin film measurement, there exists an etchant surface tension problem in the prior art that results in a poor step etch. FIG. 3 illustrates an etching solution progression for an etching solution droplet 10, positioned upon film 20 which is upon substrate 30. The etching solution progression is depicted for droplet 10 as viewed in four sequential instances, from left to right. In the first instance depicted at the left, etching solution droplet 10 is seen at the instant etching solution droplet 10 makes contact with film 20. Etching solution droplet 10 is characterized by a right contact angle θ. Upon the commencement of etching, the chemical makeup of etching solution droplet 10 changes where chemical action of etching alters the chemical makeup of etching solution droplet 10. As film 20 dissolves into etching solution droplet 10, the chemical makeup of etching solution droplet 10 becomes changed by dilution of etch products of film 20 into etching solution droplet 10.

As the chemical makeup of etching solution droplet 10 changes, one parameter that changes is the surface tension of etching solution droplet 10. Where surface tension drops, wetting increases and contact angle θ decreases. As contact angle θ decreases, wetting causes the original footprint of etching solution droplet 10 to increase as seen by the progression of illustrations in FIG. 3. As the original footprint increases, the etch also continues to penetrate film 20.

FIG. 4 illustrates a good step etch of film 20 in which an etch between the upper surface 24 of film 20 and the exposed upper surface 26 of the substrate 30 is accomplished with minimal sloping of etched walls 22. Although some sloping may be inevitable, it is desirable to achieve minimal sloping as illustrated in FIG. 4 by the distance $D_1$. The prior art problem of maskless diagnostic etching is illustrated in FIG. 5 in which an etch between upper surface 24 of film 20 and exposed upper surface 26 of substrate 30 depicts substantial sloping of etched walls 22. The distance between unetched upper surface 24 of film 20 and the last remaining portion of film 20 is illustrated by the distance $D_2$. The result of a decreasing surface tension of etching solution droplet 10 is a poor step etch of film 20 that is characterized by substantial sloping of etched walls 22 in film 20.

Any attempt to measure the thickness of film 20 is hindered by substantial sloping of etched walls 22. Substantial sloping of etched walls 22 causes a non-discrete step between upper surface 24 of film 20 and exposed upper surface 26 of substrate 30. Where a poor etch step has occurred in film 20, it is difficult to measure the thickness of film 20 with existing measurement devices and techniques such as with a stylus micrometer. In contrast, a sharp etch step produced by an anisotropic etch provides a more discrete difference in height between the upper surface 24 of film 20 and exposed upper surface 26 of substrate 30.

What is needed is an etching solution droplet that maintains its optimum surface tension qualities and thereby provides an etch that is uniform in surface tension and chemistry throughout the etch.

In connection with an etching solution that will maintain its optimum wetting qualities, what is also needed is a method of using an etching solution that will not continue its etching action once the surface to be etched is etched down to an etch stop.

SUMMARY OF THE INVENTION

The present invention is directed toward wet etch methods of anisotropically etching a substantially vertical etched step in a film. Methods of forming a substantially vertical etched step include depositing an etch solution droplet upon the surface of the film to be etched and monitoring at least one characteristic parameter of the etching solution droplet.

Control of the etching solution droplet is carried out in response to observed changes to monitored parameters of the etching solution droplet. Control is carried out through infusion and effusion of the etching solution droplet in order to replenish the chemical reactants in the etching solution droplet. Control is also carried out by partially lifting or compressing the etching solution droplet. Replenishing the etching solution droplet, while keeping the droplet of a uniform size, maintains a uniform etching chemistry as the etching solution droplet would otherwise constantly change in its chemistry as it etches material from the surface being etched. A change in the etching solution droplet chemistry is due to progressive dilution of etched materials into the droplet and is also due to depletion of etch reactants from the original chemical makeup of the droplet.

Control measures include infusion and effusion (perfusion) of the etching solution droplet, droplet size maintenance, and end-point detection for when the etching solution droplet has fully penetrated the film or surface being etched. Control measures also include control of the chemical potential, including surface tension, chemical reactant and reaction product boundary layers within the etching solution droplet, and turbulent or laminar flow control within the etching solution droplet.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 3 is a cross sectional elevation view illustrating prior art etching problems, wherein four droplets illustrate from left to right, the progressive creation of substantial sloping of etched steps.

FIG. 4 is a cross sectional elevation view illustrating a substantially vertical etched step that is the result of an anisotropic etch of a film upon a substrate.

FIG. 5 is a cross sectional elevation view illustrating an etched step in a film upon a substrate that is not substantially vertical.

DETAILED DESCRIPTION OF THE PREFERRED EMBODIMENTS

The present invention is directed toward wet etch methods of anisotropically etching a substantially vertical etched step in a film. The substantially vertical etched step in the film is accomplished by the present invention in controlling the size of an etching solution droplet by monitoring at least one characteristic parameter of the etching solution droplet and by manipulating the etching chemistry of the etching solution droplet. Through the monitoring of at least one characteristic parameter of the etching solution droplet, an operator can control the etching solution droplet in order to maintain or manipulate the etching chemistry of the droplet. Maintaining or manipulating the etching chemistry of the etching solution droplet according to methods of the present invention allows the operator to achieve a substantially vertical etch step in the film being etched.

Characteristic parameters of the etching solution droplet include the chemical potential, such as surface tension, chemical reactant and reaction products boundary layers within the etching solution droplet, laminar or turbulent flow within the etching solution droplet, and equivalents.

Etching solutions that are used with the methods of the present invention will depend upon the specific film quality to be etched. By way of non-limiting example, an etching solution for a titanium nitride (TiN) CVD film comprises a 30% hydrogen peroxide solution in water. Other etching solutions include hydrogen peroxide and ammonium hydroxide in water.

Other films contemplated to be etched by the present invention include oxide and insulating films such as gate oxides comprising silicon dioxide, BPSG, LOCOS, and equivalents. Conductive films include epitaxial silicon, titanium silicide, polysilicon, refractory metal nitrides, and equivalents. Other dielectric materials include organic inter-layer dielectrics, silicon nitrite, titania, thoria, ceria, and equivalents. Etching of the above-mentioned materials can be optimized by the use of etchants that can be determined by one of ordinary skill in the art by routine experimentation.

Bead size of the etching solution droplet can range in diameter from about one centimeter to approximately 1,000 microns. The limitations of measuring etched film depth are controlled, for example, by the thickness of a stylus point of a stylus micrometer and the ability thereof to contact a substrate underlying a film being etched without yielding a measurement from a side of an etched step of the film. Bead size of the etching solution droplet determines the amount of dissolution of the film. An unreplenished bead of an etching solution droplet has distinct stoichiometric limitations to etching through the film. One of ordinary skill in the art can calculate the amount of a film that will react with a specific size of an unreplenished bead of an etching solution droplet.

Figure 1:
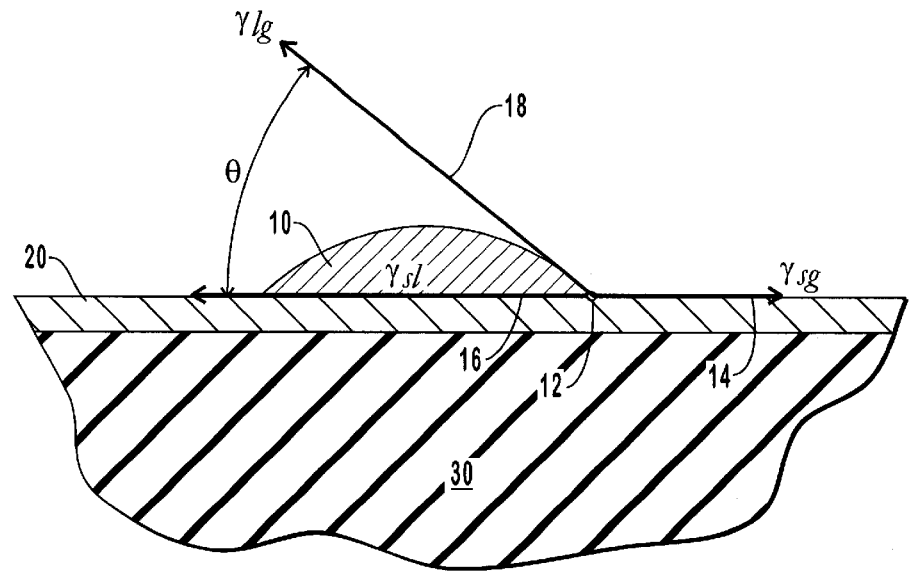
FIG. 1 is a cross sectional elevation view illustrating the surface tension of a droplet in a gaseous environment, the droplet resting upon a solid surface.
Figure 2:
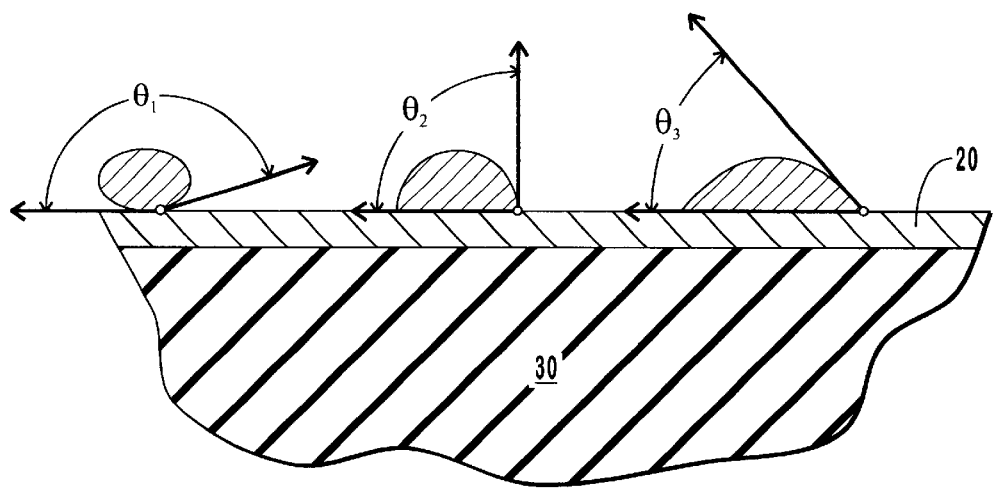
FIG. 2 is a cross sectional elevation view illustrating three droplets of three different surface tensions, comprising from left to right hydrophobic, neutral and hydrophilic droplets, respectively.
Figure 6:
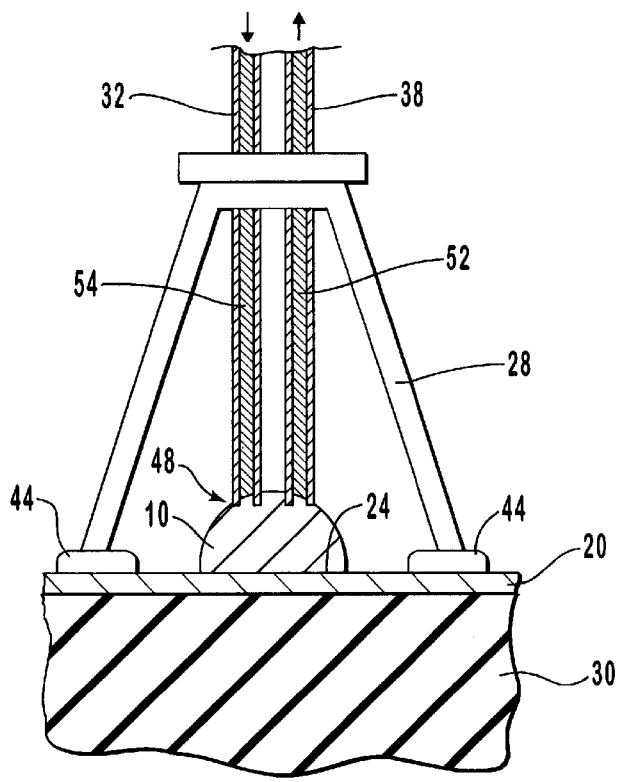
FIG. 6 is a cross sectional elevation view illustrating droplet-driven film etching, wherein the droplet characteristics are manipulated by infusion, and effusion as enabled by a device of the present invention, wherein stabilizer legs prevent unwanted vibration between the upper surface of a film to be etched and the terminal ends of various tubes of the device.

FIG. 6 illustrates an etching solution droplet 10 being perfused according to a method and an apparatus of the present invention. For the apparatus depicted in FIG. 6, bead size of the etching solution droplet is controllable by the size of tubes that convey etching solution droplet 10 to film upper surface 24, and by characteristic surface tension of etching solution droplet 10. For example, the apparatus can employ small gauge tubes, such as nanotubes, for both infusion and effusion of etching solution droplet 10. Infusion and effusion can be driven by such techniques as micropumps, magnetohydrodynamic (MHD) pumps, and bubble jet "pumps" which are capable of producing a single etching solution droplet having a volume of about 0.1 milliliters to about 10 milliliters. For example, as an observed characteristic parameter indicates that droplet perfusion is required, the operator responds by perfusing etching solution droplet 10 by use of two MHD devices that control infusion and effusion, respectively.

Modeling of the etching chemistry will assist an operator in achieving a balanced perfusion in the cases where disparate volumes are perfused through etching solution droplet 10. For example, some etch chemistries evolve gases that may escape to the ambient and etch products both dilute etching solution droplet 10 and increase its volume. Consequently for gas generation, the operator would need to effuse etching solution droplet 10 at a rate less than that of infusion. But dilution would require the operator to effuse etching solution droplet 10 at a rate greater than that of infusion. Other techniques can be used that apply simple control algorithms such as rapid reset-rate proportional-integral or proportional-integral-differential control by monitoring the size of etching solution droplet 10 and perfusing it accordingly to maintain optimum size and chemical potential during the process.

Under ideal conditions, a bead of etching solution droplet 10 would react completely with film 20 with all available etchant within etching solution droplet 10 and contact angle θ would remain substantially orthogonal to the plane of film 20. Under real time operating conditions as seen in FIG. 3, however, a reaction boundary layer 46 of etch products from film 20 forms within etching solution droplet 10, thus creating a barrier that restricts fresh etchant within etching solution droplet 10 from reaching the as yet unreacted portions of upper surface 24 of film 20 seen in FIG. 6. Additionally, a change in contact angle θ will increase the etch footprint on film 20.

A large bead of etching solution droplet 10 has the advantage of sufficient etchant to penetrate film 20; however, reaction boundary layer 46 seen in FIG. 3 within etching solution droplet 10 slows fresh etchant from contacting the etched surface of film 20 seen in FIG. 6. Additionally, the chemistry of the etching solution in etching solution droplet 10 just above the surface of film 20 may be altered due to etch products diluting and changing the makeup of etching solution droplet 10 in a reaction products boundary layer 46. Although the surface tension of etching solution droplet 10 may be unchanged above reaction boundary layer 46, surface tension below reaction boundary layer 46 may be substantially changed such that unwanted wetting by etching solution droplet 10 causes etching of a surface area that is different from the designed area. The result of a substantially changed surface tension is a sloping of etched walls 22 seen in FIG. 5 that is problematic to obtaining a discrete measurement of the thickness of film 20.

A small bead of etching solution droplet 10 has the advantage of virtually no reaction boundary layer 46, that would otherwise form. The absence of reaction boundary layer 46 is due to molecular motion paths becoming a significant fraction of droplet dimensions that keeps the chemical concentrations homogeneous within etching solution droplet 10. A small bead of etching solution droplet 10, however, may not have sufficient fresh etchant to fully penetrate film 20 down to substrate 30.

The method of the present invention replenishes a bead of etching solution droplet 10 with infusion tubes and removes etchant through effusion tubes. Thus, limiting characteristics of insufficient available etchant within a droplet, and of boundary layers 46 of reacted products from film 20 are obviated through convectional motion of fresh etchant replenishing etching solution droplet 10, a substantially unlimited supply of fresh etchant, and by optional substantially small sizes of etching solution droplet 10.

Chemical potential can define many aspects in a chemical process. In the present invention, one way to define chemical potential is by describing a reactant or etchant driving force or gradient between fresh etchant within etching solution droplet 10 that comprises a reactant solution, and film 20 that comprises a reactant solid. Chemical potential includes surface tension, the thermodynamic likelihood of reaction products, chemical reactant and reaction product boundary layers within etching solution droplet 10, reaction kinetics, turbulent or laminar flow control within etching solution droplet, 10 and equivalents.

As etching solution droplet 10 begins to penetrate into film 20, a three-dimensional surface forms between etching solution droplet 10 and film 20. Contact angle θ thus changes such that etched walls 22 seen in FIG. 3 can become wetted as well as film upper surface that is within etched walls 22. Isotropic etching is characteristic of the result of wetting on etched walls 22 and film upper surface 24. Hence, a preferred contact between droplet and film upper surface 24 would comprise no contact between etching solution droplet 10 and etched walls 22. Without wetting, no lateral etching would occur.

FIG. 6 illustrates a method of the present invention in which etching solution droplet 10 rests upon film 20 at the beginning of the etch. Characteristic parameters of etching solution droplet 10 are monitored by at least one of several techniques set forth below. In FIG. 6 it is illustrated that a first infusion tube 32 infuses etching solution droplet 10 with an etching solution influent 52. A first effusion tube 38 removes an etching solution effluent 54 from etching solution droplet 10 in response to the monitoring of at least one characteristic parameter of etching solution droplet 10. By monitoring and perfusing of etching solution droplet 10, a parameter such as surface tension can be maintained so that a virtually orthogonal contact angle of etching solution droplet 10 forms against film 20.

FIG. 6 also illustrates, in cross section, a method of stabilizing first infusion tube 32 and first effusion tube 38 to prevent unwanted vibration during control of etching solution droplet 10. Unwanted vibration comprises movement between upper surface 24 of film 20 and the lower terminus 48 of first infusion tube 32 and first effusion tube 38. In FIG.

6, first infusion tube 32 and first effusion tube 38 are held in a tube stabilizer 28. Tube stabilizer 28 rests against film 20 with optional stabilizer feet 44. Any vibrations between tubes 32, 38 and film 20 are minimized by tube stabilizer 28. Although tube stabilizer 28 is depicted as a modified A-frame, other designs such as a rectangular leg, an arcuate leg, or a tripodal design and equivalents are contemplated.

Diagnostic techniques to determine characteristic parameters of etching solution droplet 10 are preferred for several reasons. One parameter that is preferably detected is the moment when etching solution droplet 10 has reached substrate 30. If a substantially vertical etch step has been formed, the substantially vertical etch step can be compromised by continued etching due to unknown parameters such as hydrophilicity or hydrophobicity of substrate 30.

Figure 7:
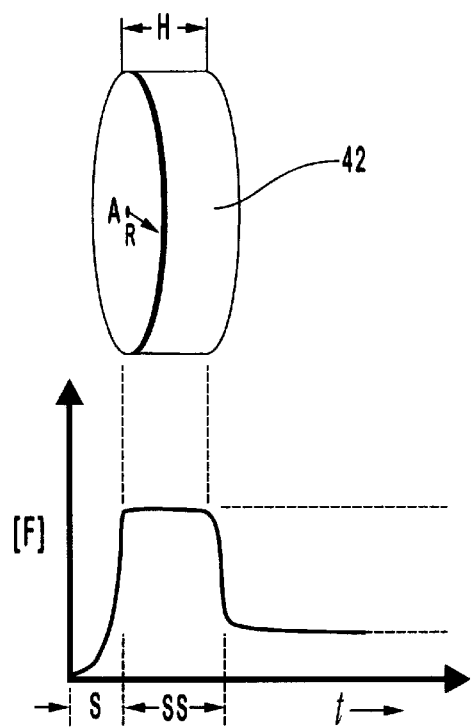
FIG. 7 illustrates a diagnostic technique used to determine when etching of a film has reached a layer therebelow that has a quality different from the film being etched, such as a substrate or an etch stop upon which the film being etched in situated.

In a method of the present invention, end point detection is accomplished as illustrated in FIG. 7. An etched disk volume 42, having a height H and radius R equal to the radius of a given etching solution droplet 10, is shown standing on edge. Etched disk volume 42 illustrates the volume of material from film 20 that is to be ideally etched in a substantially vertical etch step process. The graph below etched disk volume 42 represents analytical monitoring of, for example, the concentration of etch products of film 20 that are conveyed away from etching solution droplet 10 through effusion tubes 38. The ordinate is demarcated F, and represents, by way of non-limiting example, the concentration of etch products of film 20. The abscissa represents the passage of time after etching solution droplet 10 first contacts film 20. A first region, marked S in the graph, represents start up time of the etching process. A second region marked SS of the graph represents the time during steady state etching of etched disk volume 42, wherein the removal of etch products of film 20 is proportional to the area A of etched disk volume 42 and possibly a fraction of the growing or increasing height H of etched disk volume 42.

When etching has penetrated film 20 down to substrate 30, the concentration of etch products from film 20 will drop and be proportional only to the area represented by the height H, or a fraction of height H depending upon the degree of wetting of etched walls 22 seen in FIGS. 4 and 5, rotated through a circumference of $2\pi R$. Using this diagnostic technique, an operator or automatic controller can detect that etching has reached substrate 30 when the observed concentration of etch products within effluent portions of etching solution droplet 10 drops substantially. Upon observation of a substantial drop in the magnitude of F, etching solution droplet 10 may be immediately removed to halt the etching process. Other parameters that may be monitored in real time are the conductivity of etching solution effluent 54, its viscosity, its index of refraction, and equivalents.

Figure 8:
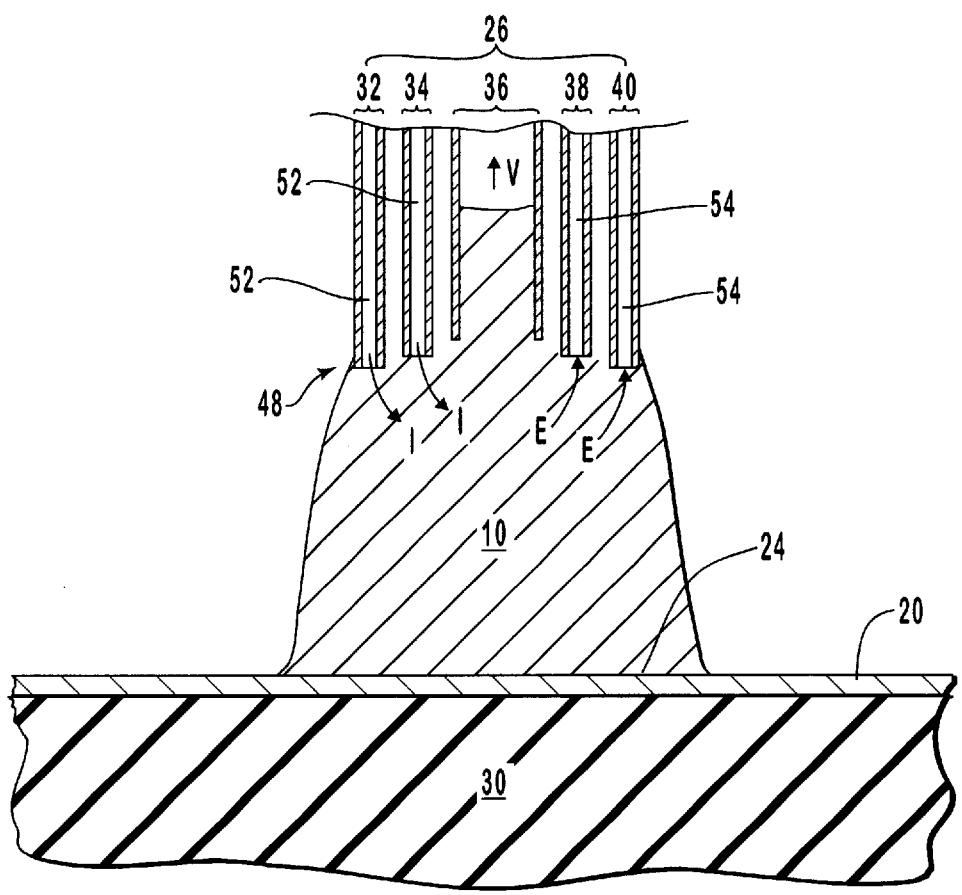
FIG. 8 is a cross sectional elevation view illustrating an apparatus for controlling an etching solution droplet by vacuum, capillary action, or wetting affinities by use of a control tube, where a transverse convective flow scheme is used in which influent etching solution enters at one side of an etching solution droplet and exits at a side opposite as at least partially diluted etching solution.

FIG. 8 illustrates a cross-sectional depiction of preferred embodiment of the resent invention that comprises manipulating the etch chemistry of etching solution droplet 10 as well as the surface tension of etching solution droplet 10. As etching solution droplet 10 begins to sink into film 20, a first etching effusion tube 38, and a second etching effusion tube 40 remove etching solution effluent 54 from etching solution droplet 10. Fresh etchant is supplied as etching solution influent 52 to etching solution droplet 10 through first infusion tube 32, and a second infusion tube 34.

Monitoring of the contact angle or the surface tension of etching solution droplet 10 can also be done, wherein a surface tension optimized bead of etching solution droplet 10 is maintained upon film upper surface 24 of film 20 within etched walls 22 seen in FIGS. 4 and 5. A surface tension optimized bead of etching solution is one that does not wet etched walls 22, but that etches substantially vertically at the perimeter of etching solution droplet 10. Monitoring the contact angle can be done through operator vigilance or through automation.

Other etching control measures include reshaping etching solution droplet 10 during the etching process. A control tube 3 seen in a cutaway view in FIG. 8, also forms a part of the apparatus. Control tube 36 can be a vacuum, a positive-pressure tube, a tube that has an affinity or a repulsive effect to etching solution droplet 10, and equivalents.

By partially lifting etching solution droplet 10, for example with a vacuum force through control tube 36, the "foot print" of etching solution droplet 10 upon upper surface 24 of film 20 can be partially controlled. The chemical environment of droplet 10 can be manipulated by infusion tubes 32, 34 and effusion tubes 38, 40. Droplet size will determine how many tubes are used in a specific application of the present invention.

A method of etching according to the present invention comprises placing etching solution droplet 10 onto film 20, controlling the footprint of etching solution droplet 10 upon film 20 by use of control tube 36, and perfusing etching solution droplet 10 to maintain a selected chemical potential.

The proper placement of infusion, effusion, and control tubes in proximity to film 20 can be accomplished using microscope focusing techniques. A method of placing tubes at a proper distance from film 20 and etching film 20 therefrom comprises determining the distance from the end of tubes to the surface of film 20, adjusting to a selected height, placing etching solution droplet 10 upon film 20, monitoring characteristic parameters of etching solution droplet 10, manipulating characteristic 10 parameters of etching solution droplet 10, and continuing the etch until an etching end point of film has been attained.

FIG. 8 also illustrates a cross-flow perfusion technique of the present invention. In a cross-flow perfusion technique, tube bundle 26 is configured such that infusion tubes 32, 34 are situated opposite effusion tubes 38, 40. Etching solution influent 52 enters at one side of etching solution droplet 10 through infusion tubes 32, 34 and exits as etching solution effluent 54 at the opposite side through effusion tubes 38, 40. This technique allows the operator to control one side of etching solution droplet 10, for example, the side into which etching solution influent 52 flows. Flow directions are depicted in FIG. 8 as influent direction I, and effluent direction E. In this way, the etch operation may achieve a substantially vertical etch step on the side that etching solution influent 52 enters etching solution droplet 10. Testing of the thickness of film 20 is then carried out on the side of etching solution droplet 10 where etching solution influent 52 entered. Control of the etch step on the side of etching solution droplet 10 where etching solution effluent is withdrawn from etching solution droplet 10 is not of concern.

Another method of etching according to the present invention comprises providing a plurality of infusion and effusion tubes near upper surface 24 of film 20. The distance between lower terminus 48 of infusion and effusion tubes and upper surface 24 is substantially less than the height of a given etching solution droplet 10 as etching solution droplet 10 would naturally form without the obstruction of infusion and effusion tubes. Following placement of infusion and effusion tubes near upper surface 24 of film 20, perfusion of etching solution droplet 10 commences. Because etching solution droplet 10 cannot form its natural height, the problem of forming unwanted contact angles is obviated. Simultaneous operation of infusion tubes and effusion tubes controls both contact angle and the chemical environment of etching solution droplet 10.

Figure 9:
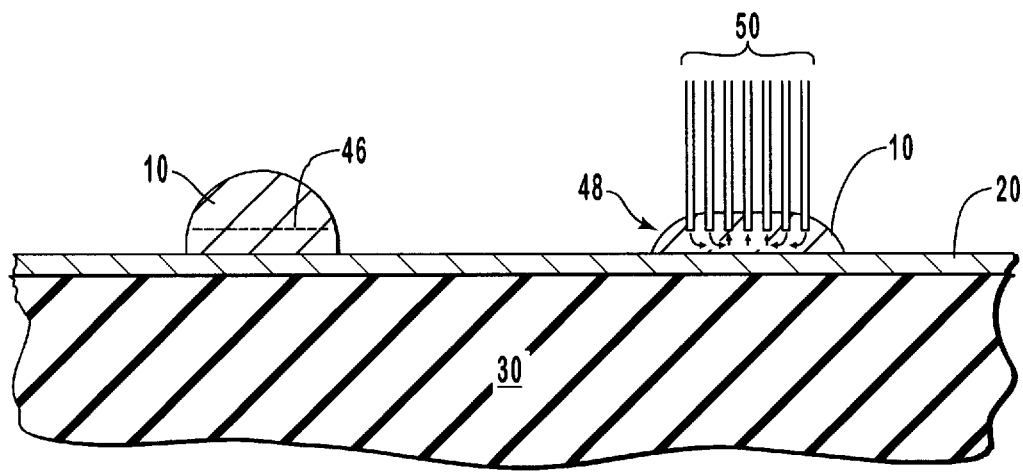
FIG. 9 is a cross sectional elevation view illustrating an apparatus for practicing a method of etching the surface of a film by placing tubes below a level at which a characteristic etch reaction boundary layer forms, and/or by alternatively creating either a perimeter flow, or a center flow convective cell within the etching solution droplet.

FIG. 9 illustrates other embodiments of the present invention, depicted in cross section. A first bead of etching solution droplet 10 is illustrated as resting upon film 20 with no tubes touching it. During etching, reaction boundary layer 46 forms and hinders further etching. The size of the first bead of etching solution droplet 10, as illustrated in FIG. 9, may be such that perfusion of etching solution droplet 10 is not required. One of ordinary skill in the art will recognize a mass-transfer analogy of the Biot modulus or the Fourier modulus. By routine experimentation, one of ordinary skill in the art will be able to determine whether the etch chemistry of a particular application of the present invention will allow etching to proceed without the perfusion method as taught also in the present invention. By using a mass-transfer analogy to the Biot modulus one of ordinary skill in the art can determine whether internal-diffusivity resistance is negligible in comparison with surface diffusivity resistance to a selected chemical potential.

A second bead of etching solution droplet 10 is illustrated as resting upon film 20 into which tubes 50 are injected. In FIG. 9, the second bead of etching solution droplet 10 is illustrated as having no boundary layer 46 although the chemical composition of etching solution droplet 10 is the same as first bead 10 at the beginning of etching. Tubes 50 can be infusion, effusion, or control tubes depending upon a selected flow pattern and depending upon the need to lift or compress etching solution droplet 10.

Optional flow patterns are illustrated in FIG. 9. One flow pattern is the perimeter flow pattern in which fresh etching solution is fed to the perimeter of etching solution droplet 10 and at least partially diluted etching solution is withdrawn from the center of etching solution droplet 10. Another flow pattern is the reverse of the perimeter pattern, system, called a center flow pattern in which fresh etching solution is fed to the center of etching solution droplet 10 and at least partially diluted etching solution is withdrawn from the perimeter of etching solution droplet 10. In FIG. 9, arrows within etching solution droplet 10 depict the preferred perimeter flow pattern.

Perimeter flow and center flow patterns create a convective cell within etching solution droplet 10 that can eliminate problems with reaction boundary layers where the convection cell prevents reaction boundary layer 46 from forming. Placement of tubes and their lower termini 48 are preferably below the level of where reaction boundary layer 46 would otherwise form.

Film thickness testing is facilitated by the etching methods of the present invention. With a substantially vertical etch step in film 20, a more discrete difference between film upper surface 24 and substrate 30 can be detected.

In addition to using the present invention as a thin film measuring technique, formation of trenches with substantially vertical etch steps can be done. Trench formation is accomplished by using the apparatus of the present invention. Etching solution droplet 10 is placed upon film upper surface 24 and etching commences. The structure comprising film 20 and substrate 30 is then translationally moved, relative to the apparatus such that etching forms a rectilinear trench.

The apparatus illustrated in FIG. 8 can be used to accomplish trench formation according to one method of the present invention. As the apparatus of the present invention is moved relative to upper surface 24 of film 20 in a translational direction, effusion tubes 38, 40 remove etching solution at a selected rate to assure substantially no residual etching solution remains from etching solution droplet 10. The transverse flow perfusion scheme illustrated in FIG. 8 provides a method of presenting fresh etching solution in etching droplet 10 at a leading edge thereof as etching solution droplet 10 moves translationally across upper surface 24 of film 20.

Effusion tubes 38, 40 seen in FIG. 8 may be arranged in a vertically staggered configuration that reach lower into etching solution droplet 10 than infusion tubes 32, 34. Although the apparatus illustrated in FIG. 8 has only two infusion tubes and two effusion tubes shown in cross section, it is within the level of one of ordinary skill in the art to configure an apparatus according to the present invention methods that contain a plurality of infusion, effusion, and control tubes depending upon the specific nature of the etch to be accomplished.

Figure 10:
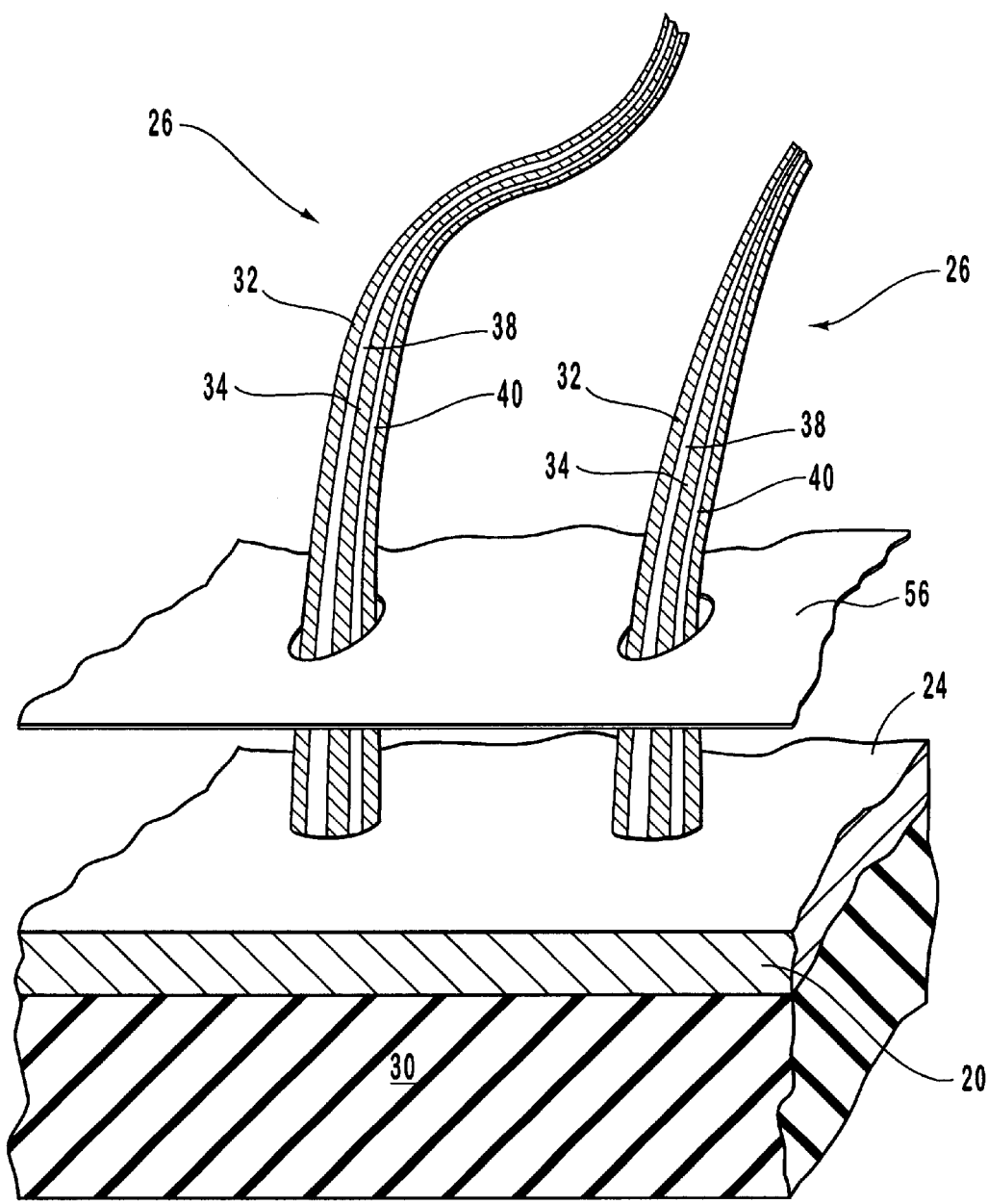
FIG. 10 is a perspective view illustrating an apparatus having a tube bundle array, wherein a plurality of infusion, effusion, control, and other tubes is arrayed in groups.

It is within the level of one of ordinary skill in the art to use X-Y pen plotter technology to form two-dimensional etch structures in film 20. Multiple pattern replication of etching trenches comprising substantially vertical etch steps can be accomplished using X-Y pen plotting technology in which an array of tube bundles 26 seen in FIG. 8 is positioned above a surface to be etched. Using X-Y pen plotting technology, the array of tube bundles 26 can replicate a plurality of identical etch patterns within upper surface 24 of film 20. FIG. 10 illustrates an application of multiple tube bundles 26 being arrayed above film 20 prior to the commencement of the etch process of the present invention. In FIG. 10, tube bundles 26 are secured in an array matrix 56, wherein tube bundles 26 comprise first and second infusion tubes 32, 34, first and second effusion tubes 38, 40, and other tubes, including a plurality of infusion and effusion tubes, and control tubes.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A droplet-etch device comprising:
    an infusion system for conveying etching solution to a single etch droplet comprising at least one infusion tube in fluid communication with a pump;
    at least one control tube in fluid communication with a gaseous pressure source for exerting pressure from said gaseous pressure source upon said single etch droplet;
    an effusion system for removing etching solution from said single etch droplet comprising at least one effusion tube in fluid communication with a pump; and
    a droplet maintenance system for maintaining a selected droplet environment comprising:
        a system of at least one droplet monitoring device for identifying droplet parameters, wherein said at least one droplet monitoring device comprises a device for quantitative analysis of a selected component of effluent withdrawn from an etching droplet.

2. A droplet-etch device according to claim 1, further comprising a structure for minimizing vibrations of said single etching droplet.

3. A droplet-etch device according to claim 1, wherein:
said infusion system comprises a metering pump and at least one capillary tube configured within said metering pump for conveying etching solution;
said effusion system comprises a metering pump and at least one capillary tube configured within said metering pump for removing etching solution; and
each said metering pump pumps from respective of said capillary tubes a single droplet.

4. A droplet-etch device according to claim 1, wherein said droplet maintenance system automatically maintains the selected droplet environment by:
automatically identifing droplet parameters; and
automatically performing quantitative analysis of said selected component of effluent withdrawn from said etching droplet.

5. A droplet-etch device according to claim 1, further comprising a droplet placement system comprising a device for two-dimensional moving of lower termini of said at least one infusion tube and at least one effusion tube.

6. A droplet-etch device according to claim 1, wherein said at least one infusion and at least one effusion tube comprises a rectilinear array of a plurality of said at least one infusion tube and at least one effusion tube.

7. A droplet-etch device comprising:
an infusion system for conveying etching solution to a single etch droplet comprising at least one capillary tube in fluid communication with a metering pump for conveying etching solution;
an effusion system for removing etching solution from said single etch droplet comprising at least one capillary tube in fluid communication with a metering pump for conveying etching solution;
at least one control tube in fluid communication with a gaseous pressure source for exerting pressure from said gaseous pressure source upon said single etch droplet; and
a droplet maintenance system for maintaining a selected droplet environment comprising:
a system of at least one droplet monitoring device for identifying droplet parameters, wherein said at least one droplet monitoring device comprises a device for quantitative analysis of a selected component of effluent withdrawn from an etching droplet.

8. A droplet-etch device according to claim 7, wherein said at least one capillary tube of said infusion system and at least one capillary tube of said effusion system comprises a rectilinear array of a plurality of said at least one capillary tube of said infusion system and at least one capillary tube of said effusion system.

9. A droplet-etch device according to claim 7, further comprising a structure for minimizing vibrations of said single etching droplet.

10. A droplet-etch device according to claim 7, wherein said droplet maintenance system automatically maintains the selected droplet environment by:
atomically identifying droplet parameters; and
atomically performing quantitative analysis of said selected component of effluent withdrawn from said etching droplet.

11. A droplet-etch device comprising:
an infusion system for conveying etching solution to a single etch droplet comprising at least one capillary tube in fluid communication with a metering pump for conveying etching solution;
an effusion system for removing etching solution from said single etch droplet comprising at least one capillary tube in fluid communication with a metering pump for conveying etching solution;
at least one control tube in fluid communication with a gaseous pressure source for exerting pressure from said gaseous pressure source upon said single etch droplet; and
a droplet maintenance system for maintaining a selected droplet environment comprising:
a system of at least one droplet monitoring device for identifying droplet parameters, wherein said at least one droplet monitoring device comprises a device for quantitative analysis of a selected component of effluent withdrawn from an etching droplet; and
a structure for minimizing vibrations of said single etching droplet, wherein each said metering pump pumps from respective of said capillary tubes a single droplet;
a droplet placement system comprising a device for two-dimensional moving of lower termini of said at least one capillary tube of said both said infusion system and said effusion system.

12. A droplet-etch device according to claim 11, wherein said at least one capillary tube of said infusion system and at least one capillary tube of said effusion system comprises a rectilinear array of a plurality of said at least one capillary tube of said infusion system and at least one capillary tube of said effusion system.

13. A droplet-etch device according to claim 11, wherein said droplet maintenance system automatically maintains the selected droplet environment by:
atomically identifying droplet parameters; and
atomically performing quantitative analysis of said selected component of effluent withdrawn from said etching droplet.

14. A droplet-etch device comprising:
an infusion system for conveying etching solution to a single etch droplet comprising at least one infusion tube in fluid communication with a pump;
an effusion system for removing etching solution from said single etch droplet comprising at least one effusion tube in fluid communication with a pump; and
a droplet maintenance system for maintaining a selected droplet environment comprising a system of at least one droplet monitoring device for identifying droplet parameters, wherein:
said at least one droplet monitoring device comprises a device for quantitative analysis of a selected component of effluent withdrawn from an etching droplet; and
said droplet maintenance system automatically maintains the selected droplet environment by:
automatically identifying droplet parameters; and
automatically performing quantitative analysis of said selected component of effluent withdrawn from said etching droplet.

15. A droplet-etch device according to claim 14, further comprising a structure for minimizing vibrations of said single etching droplet.

16. A droplet-etch device according to claim 14, wherein:
said infusion system comprises a metering pump and at least one capillary tube configured within said metering pump for conveying etching solution;
said effusion system comprises a metering pump and at least one capillary tube configured within said metering pump for removing etching solution; and each said metering pump pumps from respective of said capillary tubes a single droplet.

17. A droplet-etch device according to claim 14, further comprising a droplet placement system comprising a device for two-dimensional moving of lower termini of said at least one infusion tube and at least one effusion tube.

18. A droplet-etch device according to claim 14, wherein said at least one infusion and at least one effusion tube comprises a rectilinear array of a plurality of said at least one infusion tube and at least one effusion tube.

19. An etchant dispenser comprising:
    an infusion system for conveying an etching solution to a single etch droplet including an infusion tube in fluid communication with a pump;
    an effusion system for removing said etching solution from said single etch droplet including an effusion tube in fluid communication with a pump; and
    a droplet maintenance system for maintaining an environment of said single etch droplet, said system comprising:
        a monitoring device to monitor a constituent in said single etch droplet during operation of the etchant dispenser; and
        a manipulating device for manipulating said constituent in said single etch droplet during operation of the etchant dispenser.

20. The etchant dispenser as defined in claim 19, wherein said droplet maintenance system automatically maintains the environment of said single etch droplet by:
    atomically monitoring the constituent in said single etch droplet during operation of the etchant dispenser; and
    atomically manipulating said constituent in said single etch droplet during operation of the etchant dispenser.

21. The etchant dispenser as defined in claim 19, further comprising a plurality of said infusion tubes and a plurality of said effusion tubes, each included, respectively, in said infusion and effusion systems.

22. An etchant dispenser comprising:
    an infusion system for conveying an etching solution to a single etch droplet including at least one capillary tube in fluid communication with a metering pump for conveying said etching solution;
    an effusion system for removing said etching solution from said single etch droplet including at least one capillary tube in fluid communication with a metering pump for conveying said etching solution;
    at least one control tube in fluid communication with a gaseous pressure source for exerting pressure from said gaseous pressure source upon said single etch droplet; and
    a droplet maintenance system for maintaining an environment of said single etch droplet, said system comprising:
        a monitoring device to monitor a constituent in said single etch droplet during operation of the etchant dispenser; and
        a manipulating device for manipulating said constituent in said single etch droplet during operation of the etchant dispenser.

23. The etchant dispenser as defined in claim 22, wherein said droplet maintenance system automatically maintains the environment of said single etch droplet by:
    atomically monitoring the constituent in said single etch droplet during operation of the etchant dispenser; and
    atomically manipulating said constituent in said single etch droplet during operation of the etchant dispenser.

24. An etchant dispenser comprising:
    an infusion system for conveying an etching solution to a single etch droplet including at least one capillary tube in fluid communication with a metering pump for conveying said etching solution;
    an effusion system for removing etching solution from said single etch droplet including at least one capillary tube in fluid communication with a metering pump for conveying said etching solution;
    at least one control tube in fluid communication with a gaseous pressure source for exerting pressure from said gaseous pressure source upon said single etch droplet; and
    a droplet maintenance system for maintaining an environment of said single etch droplet, said system comprising:
        a monitoring device to monitor a constituent in said single etch droplet during operation of the etchant dispenser;
        a manipulating device for manipulating said constituent in said single etch droplet during operation of the etchant dispenser;
        a structure for minimizing vibrations of said single etching droplet;
        a droplet placement system including a moving device for two-dimensional moving of lower termini of said at least one capillary tube of:
            said infusion system; and
            said effusion system.

25. The etchant dispenser as defined in claim 24, wherein said droplet maintenance system automatically maintains the environment of said single etch droplet by:
    atomically monitoring the constituent in said single etch droplet during operation of the etchant dispenser; and
    atomically manipulating said constituent in said single etch droplet during operation of the etchant dispenser.

* * * * *

UNITED STATES PATENT AND TRADEMARK OFFICE
CERTIFICATE OF CORRECTION

PATENT NO. : 6,245,191 B1
DATED : June 12, 2001
INVENTOR(S) : Garo J. Derderian and Gurtej S. Sandhu It is certified that error appears in the above-identified patent and that said Letters Patent is hereby corrected as shown below:

Column 3,
Line 32, change "that" to -- to illustrate --

Column 5,
Line 32, after "and" insert -- such --

Column 6,
Line 41, after "surface" insert -- 24 --

Column 7,
Line 54, before "preferred" insert -- a --
Line 55, before "invention" change "resent" to -- present --

Column 8,
Line 9, after "3" insert -- , --

Column 10,
Line 18, change "contain" to -- contains --
Line 40, change "illustrated" to -- illustrative --

Signed and Sealed this

Seventh Day of May, 2002

Attest:

Attesting Officer

JAMES E. ROGAN
*Director of the United States Patent and Trademark Office*